(12) United States Patent
McBride

(10) Patent No.: US 6,389,578 B1
(45) Date of Patent: May 14, 2002

(54) METHOD AND APPARATUS FOR DETERMINING THE STRENGTHS AND WEAKNESSES OF PATHS IN AN INTEGRATED CIRCUIT

(75) Inventor: John G McBride, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/318,988

(22) Filed: May 26, 1999

(51) Int. Cl.⁷ .............................................. G06F 17/50
(52) U.S. Cl. .................................. 716/5; 716/4; 716/6
(58) Field of Search .................... 716/5, 4, 6

(56) References Cited

U.S. PATENT DOCUMENTS

| | | | | |
|---|---|---|---|---|
| 5,012,471 A | * | 4/1991 | Powell et al. ............... | 324/73.1 |
| 5,305,229 A | * | 4/1994 | Dhar .............................. | 716/5 |
| 5,671,150 A | * | 9/1997 | Maxwell ........................ | 716/4 |
| 5,787,008 A | * | 7/1998 | Pullela et al. ................. | 716/6 |

\* cited by examiner

Primary Examiner—Huan Hoang

(57) ABSTRACT

The present invention provides a method and apparatus for determining the strongest and weakest paths from a supply of a gate comprised in an integrated circuit to an output node of the gate and from ground to the output node of the gate. The apparatus comprises a computer capable of being configured to execute a rules checker program. When the rules checker program is executed by the computer, it analyzes information relating to the network and determines the strongest and weakest paths from the supply to the output node of the gate and from ground to the output node of the gate. The rules checker program calculates the effective widths of the PFET and NFET networks in the gate being evaluated and uses this information to determine the strongest and weakest paths from the supply to the output node of the gate and from ground to the output node of the gate. Once the strongest and weakest paths have been determined, information relating to the strongest and weakest paths is utilized by the rules checker to model the gate as an inverter having a single PFET and a single NFET. Two models are generated for this purpose. One model corresponds to the strongest PFET and the weakest NFET and a second model corresponds to the strongest NFET and the weakest PFET. The PFET-to-NFET ratios of the models can be used to determine various design characteristics of the gate, such as, for example, the noise immunity of the gate.

15 Claims, 9 Drawing Sheets

METHOD AND APPARATUS FOR DETERMINING THE STRENGTHS AND WEAKNESSES OF PATHS IN AN INTEGRATED CIRCUIT

TECHNICAL FIELD OF THE INVENTION

The present invention generally relates to computer-aided circuit design systems and, more particularly, to a method and apparatus for evaluating the design quality of a network of nodes in a logic gate of an integrated circuit to determine the strongest and weakest paths from the supply and the ground of the gate to an output node of the gate.

BACKGROUND OF THE INVENTION

Integrated circuits are electrical circuits comprised of transistors, resistors, capacitors, and other components comprised on a single semiconductor "chip" in which the components are interconnected to perform a given function. Typical examples of integrated circuits include, for example, microprocessors, programmable logic devices (PLDs), electrically erasable programmable memory devices (EEPROMs), random access memory devices (RAMs), operational amplifiers and voltage regulators. A circuit designer typically designs the integrated circuit by using very large scale integrated (VLSI) circuit design techniques to create a circuit schematic which indicates the electrical components and their interconnections. Often, designs are simulated by computer to verify functionality and to ensure that performance goals are satisfied.

In the world of electrical device engineering, the design and analysis work involved in producing electronic devices is often performed using electronic computer aided design (E-CAD) tools. As will be appreciated by those skilled in the art, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions, or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems identify certain critical timing paths, and then evaluate the circuit to determine whether timing violations may occur through the critical paths. As is known, timing specifications may be provided to such systems by way of a configuration file.

One such system known in the prior art is marketed under the name PathMill, by EPIC Design Technology, Inc., subsequently purchased by Synopsis, Inc. PathMill is a transistor-based analysis tool used to find critical paths and to verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. One primary shortcoming of the PathMill program is that it does not analyze the circuits to determine the design quality of the circuits. Rather, PathMill performs a static timing analysis of a circuit using the netlist provided to PathMill. Furthermore, configuring PathMill to recognize various circuit characteristics is typically a very difficult task.

Accordingly, a need exists for a rules checking system that will allow circuits to be evaluated for design quality. The present invention works in conjunction with a tool, such as, for example, PathMill, to build a database which is then utilized by the rules checking system of the present invention to evaluate the design quality of network nodes. Typically, such tools, including PathMill, receive a netlist and use the netlist to determine FET (field effect transistor) direction, node types, latches, dynamic gates, rise and fall times, etc. This information is utilized by the present invention to determine the strongest and weakest paths from a supply of a gate to an output node of the gate and from the ground of the gate to the output node of the gate. Once the strongest and weakest paths from the supply and from ground to the output node have been determined, this information can be used to determine various design characteristics of the gate, such as, for example, the noise susceptibility of the gate.

SUMMARY OF THE INVENTION

The present invention provides a method and apparatus for determining the strongest and weakest paths from a supply of a gate comprised in an integrated circuit to an output node of the gate and from ground to the output node of the gate. The apparatus comprises a computer capable of being configured to execute a rules checker program. When the rules checker program is executed by the computer, it analyzes information relating to the network and determines the strongest and weakest paths from the supply to the output node of the gate and from ground to the output node of the gate.

In accordance with the preferred embodiment of the present invention, the rules, checker program calculates the effective widths of the PFET and NFET networks in the gate being evaluated and uses this information to determine the strongest and weakest paths from the supply, VDD, to the output node of the gate and from ground to the output node of the gate. Once the strongest and weakest paths have been determined, information relating to the strongest and weakest paths is utilized by the rules checker to model the gate as an inverter having a single PFET and a single NFET. Two models are generated for this purpose. One model corresponds to the strongest PFET and the weakest NFET and a second model corresponds to the strongest NFET and the weakest PFET. The PFET-to-NFET ratios of the models can be used to determine various design characteristics of the gate, such as, for example, the noise immunity of the gate.

Other features and advantages of the present invention will become apparent from the following description, drawings and claims.

DETAILED DESCRIPTION OF THE INVENTION

Figure 1:
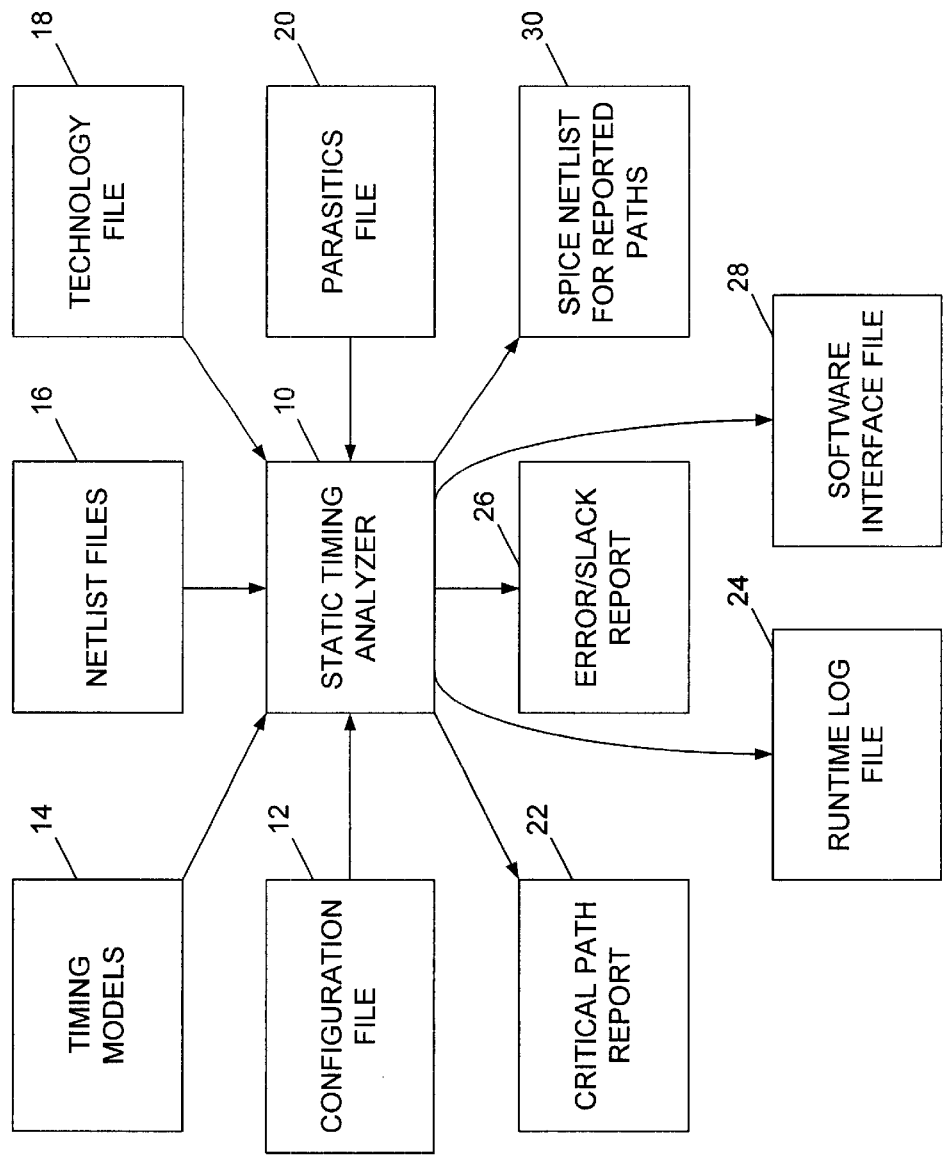
FIG. 1 is a block diagram of a static timing analyzer system, which is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their inter-relations.

Figure 2:
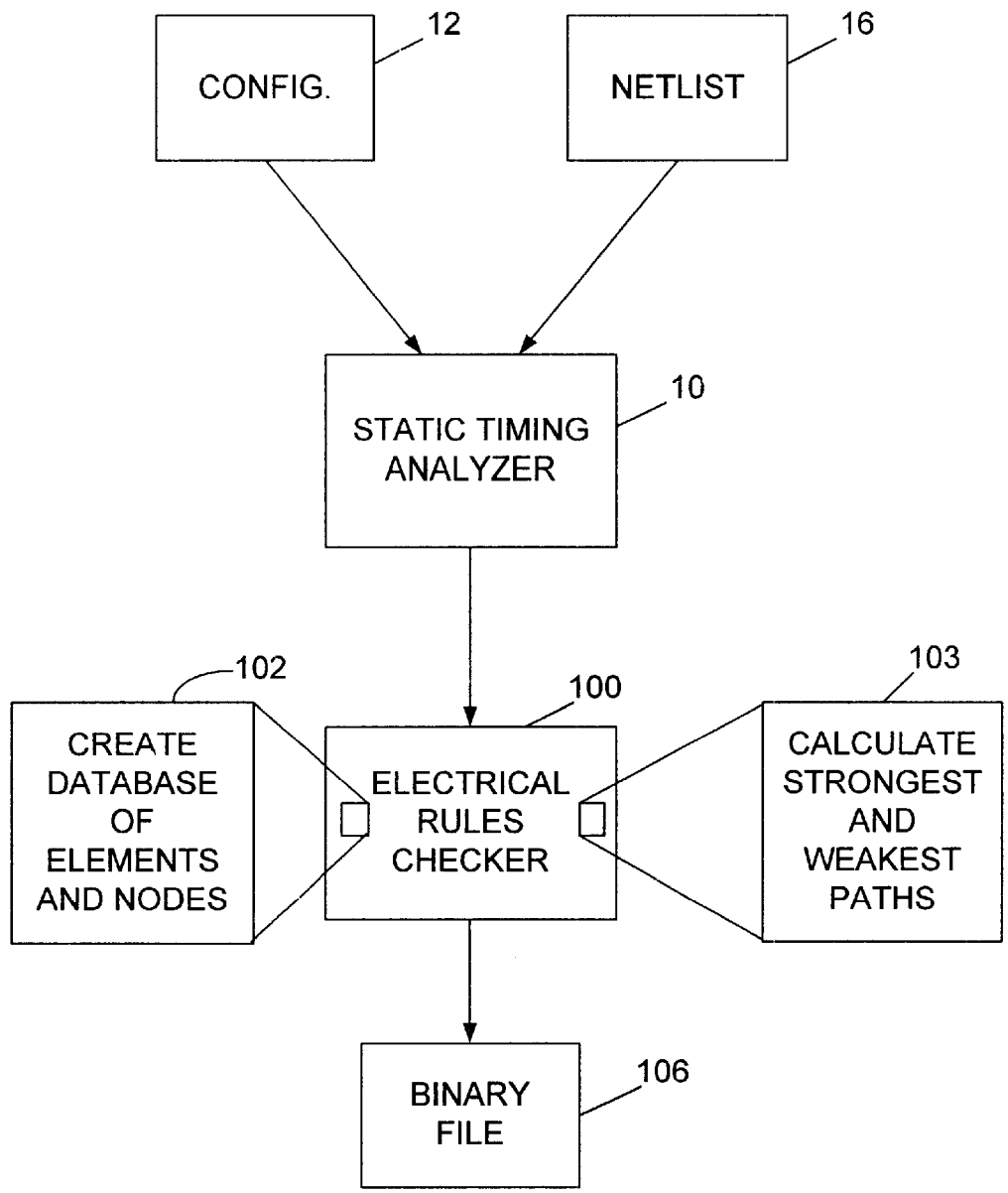
FIG. 2 is a block diagram illustrating the orientation of the electrical rules checker of the present invention in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker program 100 of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated is generated. This database is then utilized by the electrical rules checker 100 of the present invention to perform the rules checking tasks.

The manner in which this database is generated will now be discussed below with respect to FIGS. 3A–3C. For purposes of illustration, it will be assumed that the static timing analyzer 10, shown in FIG. 2 and discussed above, is the Pathmill static timing analyzer, in order to provide an example of one possible implementation of the present invention. However, those skilled in the art will understand that the electrical rules checker 100 of the present invention and the database of the present invention are not limited to use with any particular program. Also, it should be noted that the generation of the database is not critical to the present invention, as will be understood by those skilled in the art. Utilization of the database of the present invention enables the rules checker 100 to maximize efficiency in performing its tasks and reduces the number of application program interface (API) calls to the timing analyzer 10.

The Pathmill static timing analyzer provides an API which allows the Pathmill static timing analyzer to communicate with the electrical rules checker 100 of the present invention. This API allows code external to the Pathmill program to be linked to the Pathmill program so that the external code and the Pathmill program itself comprise one executable which can be run as a single program. The electrical rules checker 100 of the present invention utilizes this API to obtain information from the Pathmill static timing analyzer which can be utilized by the electrical rules checker 100 to generate the database of the present invention, as indicated by block 102. This database is then utilized by the rules checker program 100 to perform the task 103 of determining the strongest and weakest paths from the supply VDD to the output node of a logic gate and from ground to the output node of the logic gate, as discussed below in more detail with reference to FIGS. 4–10.

Prior to the database of the present invention being generated, the Pathmill program runs and identifies circuit characteristics of the circuit under consideration such as, for example, FET direction, node types, latches, dynamic gates, clocks, rise and fall times, etc. Before the Pathmill program terminates, it calls the electrical rules checker 100 of the present invention. The Pathmill program has a feature commonly referred to as "hooks", which allows the Pathmill program to call routines at various stages of execution. Once the Pathmill program has finished identifying the characteristics mentioned above, the Pathmill program calls the electrical rules checker 100 of the present invention. The electrical rules checker 100 of the present invention, through this series of subroutine calls, creates its own database of the circuit under consideration.

Figure 3A:
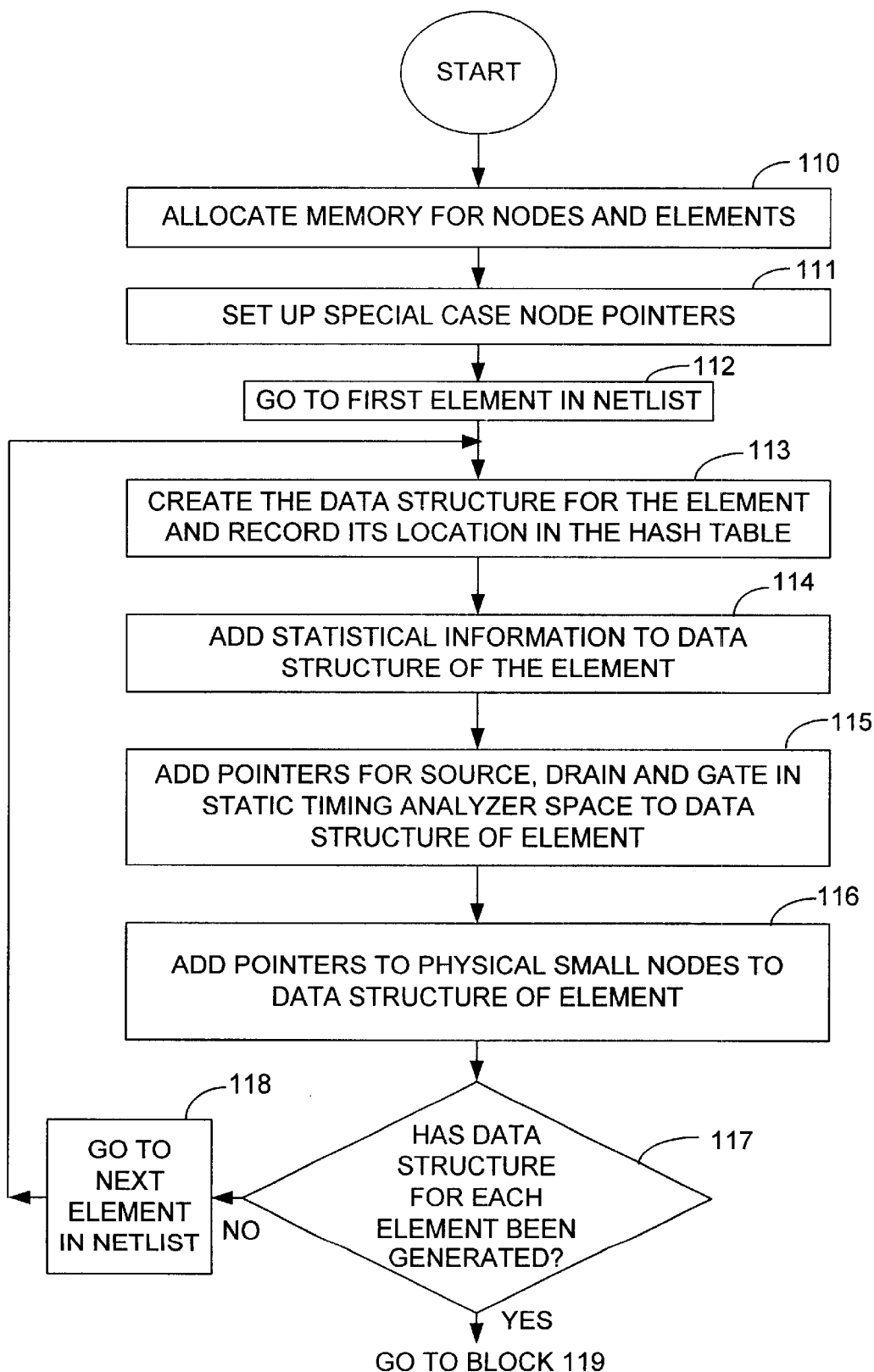
FIGS. 3A–3C together form a flow chart which illustrates the method of the present invention for generating the database of the present invention which can be utilized by the electrical rules checker of the present invention shown in FIG. 2 to perform rules checking tasks.
Figure 3B:
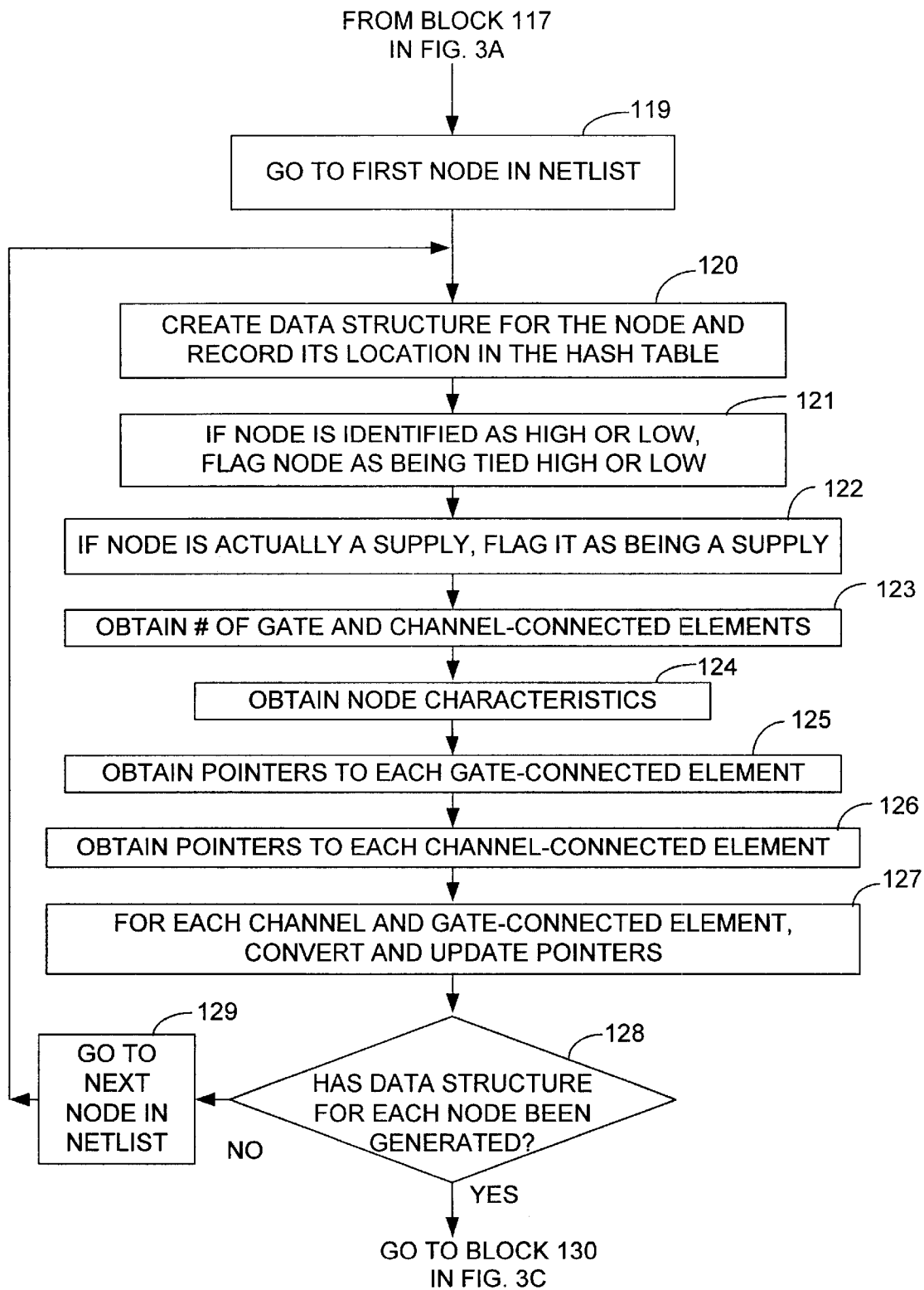

The first step in the process of generating the database is to allocate memory for the nodes and elements of the circuit, as indicated by block 110 in FIG. 3A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated.

However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 111. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 113–116 in FIG. 3A correspond to the steps for creating the element data structures. The first element for which a data structure must be generated is obtained during the step represented by block 112. The data structure for that element is then generated and the location of the data structure is recorded in a hash table, as indicated by block 113. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 114. This information includes, for example, the width of the element, the length of the element, the direction of the element, and the element type. Once the statistical information has been included in the data structure of the element, the pointers for the source, drain and gate of the element, as defined in the space of the static timing analyzer, are included in the data structure of the element, as indicated by block 115. The pointers that were set up in step 111 are utilized in step 115. If either the source, drain or gate of the element is attached to ground or VDD, then the pointers for the source, drain and gate are set to the pointers for ground or VDD obtained in step 111.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 116, the pointers corresponding to these small nodes are added to the data structure of the element. A determination is then made at block 117 as to whether or not data structures for all of the elements have been generated. If not, the next element in the netlist is obtained, as indicated by block 118, and the process returns to block 113. If so, the process proceeds to block 119 in FIG. 3B.

Once the data structures for the elements have been generated, the data structures for the nodes are generated. Blocks 120–127 in FIG. 3B correspond to the steps in the process of the present invention for generating the data structures of the nodes. The first node for which the data structure is to be generated is obtained at the step represented by block 119. The data structure for the node is then generated and the location of the data structure is recorded in the hash table, as indicated by block 120.

For the purpose of design quality analysis, it is important to distinguish actual supply nodes, such as VDD and GND, from other circuit nodes which have been declared to be tied high or low for the purpose of timing or other analysis. In block 121, the rules checker 100 determines, through the use of PathMill API calls, which nodes have been declared to be tied high or low, or are actually high or low because they are actual supply nodes. The rules checker 100 flags declared or actual high nodes as high and declared or actual low nodes as low in the step represented by block 121. In the step represented by block 122, the nodes which are actually supplies are flagged as supplies in the database.

The electrical rules checker 100 then obtains the number of gate-connected elements and the number of channel-connected elements from the static timing analyzer, as indicated by block 123. The electrical rules checker 100 also obtains the characteristics of the nodes from the static timing analyzer 10, as indicated by block 124. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 125. The electrical rules checker 100 then obtains the pointers from the static timing analyzer which point to each channel-connected element, as indicated by block 126.

The element pointers that are stored in the node during the steps represented by blocks 125 and 126 are pointers into the space of the static timing analyzer. Similarly, the node pointers that are stored in the element during the step represented by block 115 are pointers into the space of the static timing analyzer, except that the pointers to the VDD and GND nodes are stored as pointers to the VDD and GND nodes in the space of the electrical rules checker 100. In the step represented by block 127, some of these pointers are converted to point to the elements and nodes in the space of the electrical rules checker 100. For each of the gate-connected and channel-connected elements of the current node, the following steps are performed, which are represented by block 127:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 128 as to whether or not data structures for all of the nodes have been generated. If not, the next node in the netlist is obtained, as indicated by block 129, and the process returns to block 120.

Figure 3C:
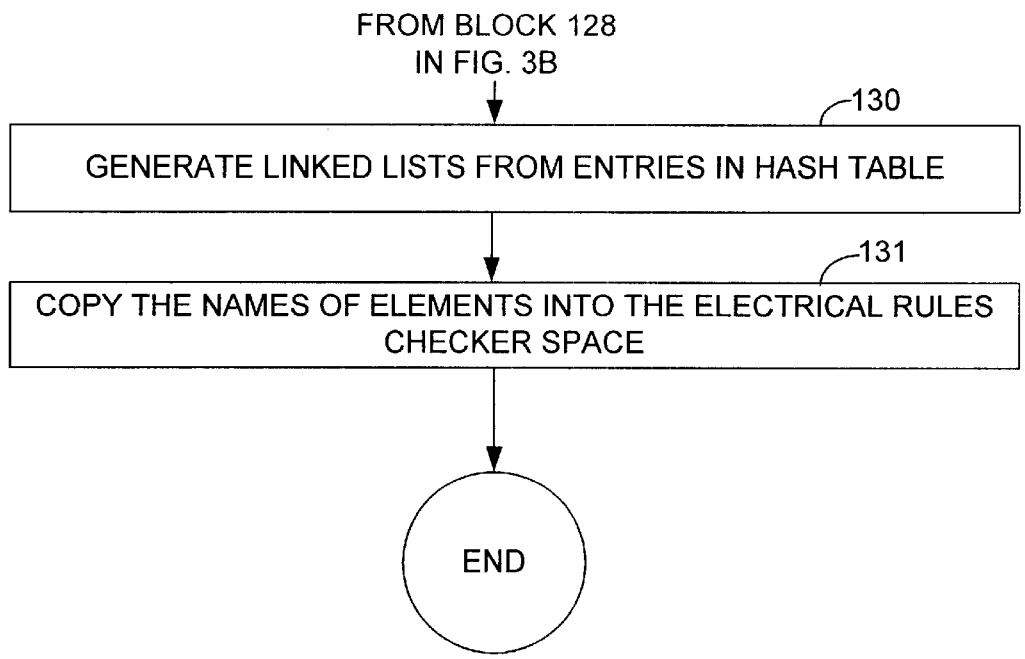

In order to enable the electrical rules checker 100 to maximize efficiency in searching the database of the present invention, once the data structures for all of the nodes have been created, linked lists of elements and nodes are generated from the entries in the hash table, as indicated by block 130 in FIG. 3C. These lists are used by the electrical rules checker 100 of the present invention when searching for an element or node in the database of the present invention.

It should be noted that the arrangement of the elements and nodes in the linked lists may or may not have any physical relationship to the arrangement of the elements and nodes in the circuit under consideration. Thus, the linked lists are merely used to search through the elements and nodes stored in the database.

Once the linked lists have been generated, the names of the elements and nodes contained in the linked list are copied into electrical rules checker space, as. indicated by block 131. This reduces the number of calls that need to be made to the PathMill program by the electrical rules checker 100. Once the database of the present invention has been generated, no more calls have to be made to the PathMill program via the PathMill API. The database of the present invention is comprised as the binary file 106 shown in FIG. 2.

Once the database of the present invention has been generated in the manner described above, the electrical rules checker 100 of the present invention utilizes this database to perform the rules checking tasks.

Figure 4:
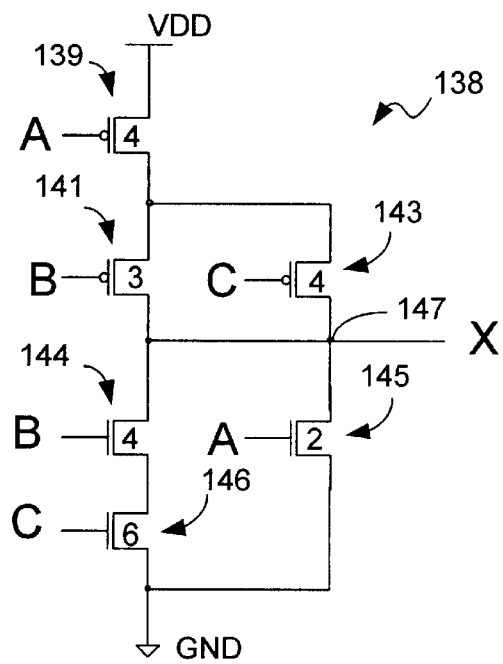
FIG. 4 is a schematic diagram of a logic gate which is modeled as an inverter in order to evaluate various design characteristics of the gate.

As stated above, in accordance with the present invention, the electrical rules checker 100 evaluates a logic gate, such as the logic gate 138 shown in FIG. 4, and determines the strongest and weakest paths from VDD to the output X of the gate 138 and from ground to the output X of the gate 138. The gate 138 will be utilized to describe the manner in which the electrical rules checker 100 determines the strongest and weakest paths. However, those skilled in the art will understand that the present invention is not limited to any particular gate or type of gate. Furthermore, it should be noted that the present invention is capable of determining the strongest and weakest paths through static gates and dynamic gates (i.e., gates which implement dynamic domino logic).

The gate 138 shown in FIG. 4 is an AND-OR-INVERT (AOI) gate. The gate 138 comprises a network of PFETs 139, 141 and 143 and a network of NFETs 144, 145 and 146. Each of the FETs has a width and a length which affect the strength of the paths through the circuit. For purposes of illustration, it is assumed that the lengths of all of the FETs is 1 so that only the widths of the FETs need to be taken into account in determining the strengths and weaknesses of the paths. The widths of the FETs are indicated by numerals adjacent the FETs in the figures. The FETs 139, 143 and 144 all have a width of 4. The FET 141 has a width of 3. The FET 145 has a width of 2. The FET 146 has a width of 6.

Figure 5:
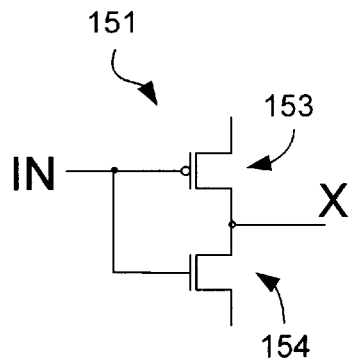
FIG. 5 is a schematic diagram of an inverter which is used to model the gate shown in FIG. 4.

In accordance with the present invention, these widths are utilized to calculate the strongest and weakest paths from VDD and from ground GND to the output node X of the gate 138. Once the strongest and weakest paths have been determined, the logic gate 138 can be modeled as inverters having PFET-to-NFET ratios related to the determinations of the strongest and weakest paths. FIG. 5 illustrates a schematic diagram of an inverter 151 which is used to model the logic gate 138 shown in FIG. 4. The inverter comprises a PFET 153 and an NFET 154 which are channel-connected and which have their gates tied together at the input node of the inverter. The PFET 153 has a width, $W_p$, and the NFET 154 has a width, $W_n$. These widths are utilized by the electrical rules checker 100 to obtain a PFET-to-NFET ratio for the inverter 151.

As stated above, two inverter models preferably are generated. The manner in which these models are generated will be discussed below in more detail. The PFET-to-NFET ratios of the models can then be utilized by the electrical rules checker 100 to evaluate various design characteristics of the gate 138, such as, for example, the noise susceptibility of the gate 138. By modeling the gate as an inverter, the design characteristics of the gate can be evaluated without the need for utilizing a simulation routine such as, for example, SPICE.

Figure 6:
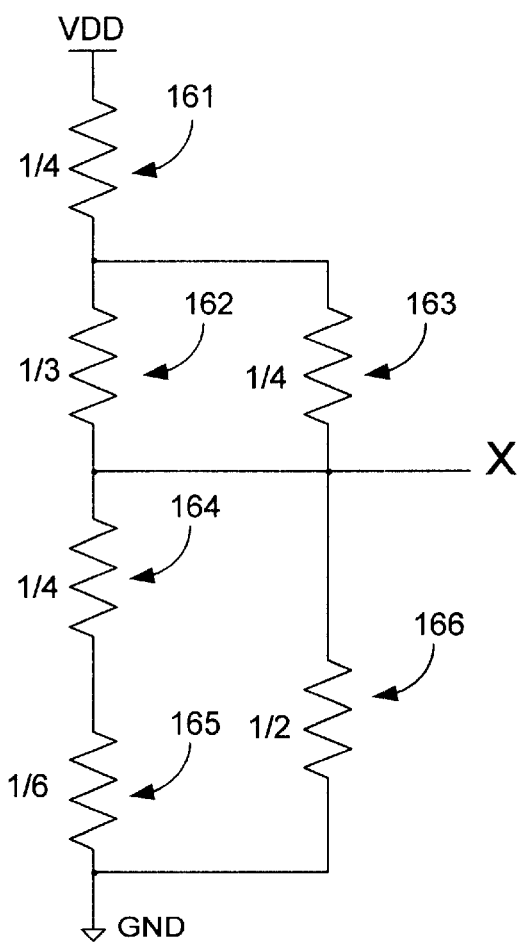
FIG. 6 is a schematic diagram of the circuit shown in FIG. 4 wherein the FETs of the circuit shown in FIG. 4 have been replaced by resistivity values for the purpose of determining the strongest and weakest paths from the supply and from ground to the output node of the gate.

In order to model the gate 138 as an inverter, the gate 138 is first approximated by substituting resistivity values for the FETs. This is shown in FIG. 6. The resistivity values are obtained by dividing the lengths of the FETs by the widths of the FETs. Assuming a length of one for purposes of illustration, the resistivity values correspond to the reciprocals of the widths of the FETs, as indicated in FIG. 6. In order to calculate the strongest path from VDD to the output X, each PFET is evaluated separately. When evaluating the PFET network from the perspective of the PFET 143, it is assumed that the PFET 141 is off since the PFET 141 is a parallel path from VDD to the output node 147. It is also assumed that the PFET 139 is on since it must be on in order to provide a path from PFET 139 to the output node 147.

The strength of the path from VDD through PFETs 139 and 143 to the output node is then calculated by adding the resistivity values corresponding to PFETs 139 and 143 together. Therefore, the strength of this path is $\frac{1}{4}+\frac{1}{4}$, or $\frac{1}{2}$. Similarly, when considering the strength of the path from the perspective of the PFET 141, it is assumed that PFET 143 is off and that PFET 139 in on. Therefore, the strength of this path is $\frac{1}{3}+\frac{1}{4}$, or $\frac{7}{12}$.

When considering the strength of the path from VDD to the output node 147 from the perspective of PFET 139, it is assumed that both PFETs 141 and 143 are both on since they provide parallel paths from VDD to the output node 147. Therefore, the effective resistivity of the parallel PFETs is calculated by multiplying the resistivity values of the parallel paths together and by dividing the product by the sum of these resistivity values. Therefore, the resistivity value of the parallel paths is $(\frac{1}{3})(\frac{1}{4})/(\frac{1}{3}+\frac{1}{4})$, or $\frac{1}{7}$. The equivalent resistivity value of the entire path is then obtained by adding the resistivity value of the parallel path to the resistivity value of PFET 139. Therefore, the equivalent resistivity value of the entire path is $\frac{1}{7}+\frac{1}{4}$, or $\frac{11}{28}$.

Once these calculations have been made, the strongest path is determined by determining the path having the lowest resistivity value corresponds to the strongest path from VDD to the output node 147. Since $\frac{11}{28}$ is the smallest of the resistivity values, it is determined that the strongest path is from VDD to the output node 147 corresponds to a state when all of the PFETs 139, 141 and 143 are on, i.e., when signals A, B and C are all low.

In order to obtain the weakest path from VDD to the output node X, the largest of the resistivity values of the resistors that are in parallel is obtained and then this value is added to the resistivity values of the series resistors. For example, since the resistivity value of the resistor 162 is greater than the resistivity value of the resistor 163, the resistivity value of the resistor 162 is added to the resistivity value of the resistor 161 to obtain a total resistivity value of $\frac{7}{12}$, or 0.583. It can be seen from these total resistivity values that the strongest path corresponds to the lowest total resistivity value and the weakest path corresponds to the highest total resistivity value.

Therefore, the weakest path from VDD to the output node X corresponds to a state when A and B are low (i.e., FETs 139 and 141 are activated) and the input C is high (i.e., FET 143 is off, or deactivated).

The strongest and weakest paths from ground GND to the output node X are obtained in an identical manner. For example, since the path containing NFET 145 is in parallel with the path containing NFETs 144 and 146, it is assumed that NFETs 144 and 146 are off when evaluating the strongest path from ground through NFET 145 to the output node 147. Similarly, it is assumed that NFET 145 is off when evaluating the strongest path from ground through NFETs 144 and 146 to the output node 147. Therefore, the path through NFETs 144 and 146 has an equivalent resistivity value of $\frac{1}{4}+\frac{1}{6}$, $\frac{5}{12}$. The path through NFET 145 has a resistivity value of $\frac{1}{2}$. Since $\frac{5}{12}$ is less than $\frac{1}{2}$, the strongest path from ground to the output node 147 corresponds to a state when B and C are high and A is low.

Once the strongest and weakest paths from VDD and from ground to the output node X have been obtained, the gate 138 may be modeled as an inverter, such as that shown in FIG. 5. As stated above, preferably, two inverter models are generated. One of the inverter models comprises a PFET 153 having a width which corresponds to the total resistivity value of the PFET network for the strongest path from VDD to the output X. Using the total resistivity values obtained above, the PFET 153 of the first model would have a width equal to the reciprocal of the total resistivity value of $11/28$, or 2.54.

Similarly, the NFET 154 of the first model would have a width corresponding to the reciprocal of the total resistivity value for the weakest path from ground GND to the output node X. The weakest path from ground to the output X corresponds to the path from ground through resistor 166 to the output node X since a resistivity value of ½ (resistor 166) is greater than the sum of the resistivity values of ¼+⅙ (resistors 164 and 165). Therefore, the NFET 154 of the inverter model 151 would have a width of 2, which corresponds to the reciprocal of the resistivity value of resistor 166.

The second model would be identical to the first model except that the PFET 153 would have a width corresponding to the weakest path from VDD to the output node X and the NFET 154 would have a width corresponding to the strongest path from ground to the output node X. Therefore, the PFET 153 would have a width of the reciprocal of $7/12$, or 1.71 and the NFET 154 would have a width equal to the reciprocal of ($5/12$), or 2.40.

Once these models have been generated, the PFET-to-NFET ratios of each of the models can be easily obtained by simply dividing the width of the PFET of the model by the width of the NFET of the model. As stated above, these PFET-to-NFET ratios can be utilized to evaluate various design quality characteristics of the gate. For example, the PFET-to-NFET ratios can be utilized to evaluate the noise immunity of the gate, the speed of the gate, the functionality of the gate, etc. The manner in which the PFET-to-NFET ratios of the inverter models can be utilized to evaluate these various design characteristics will be understood by those skilled in the art.

Figure 7:
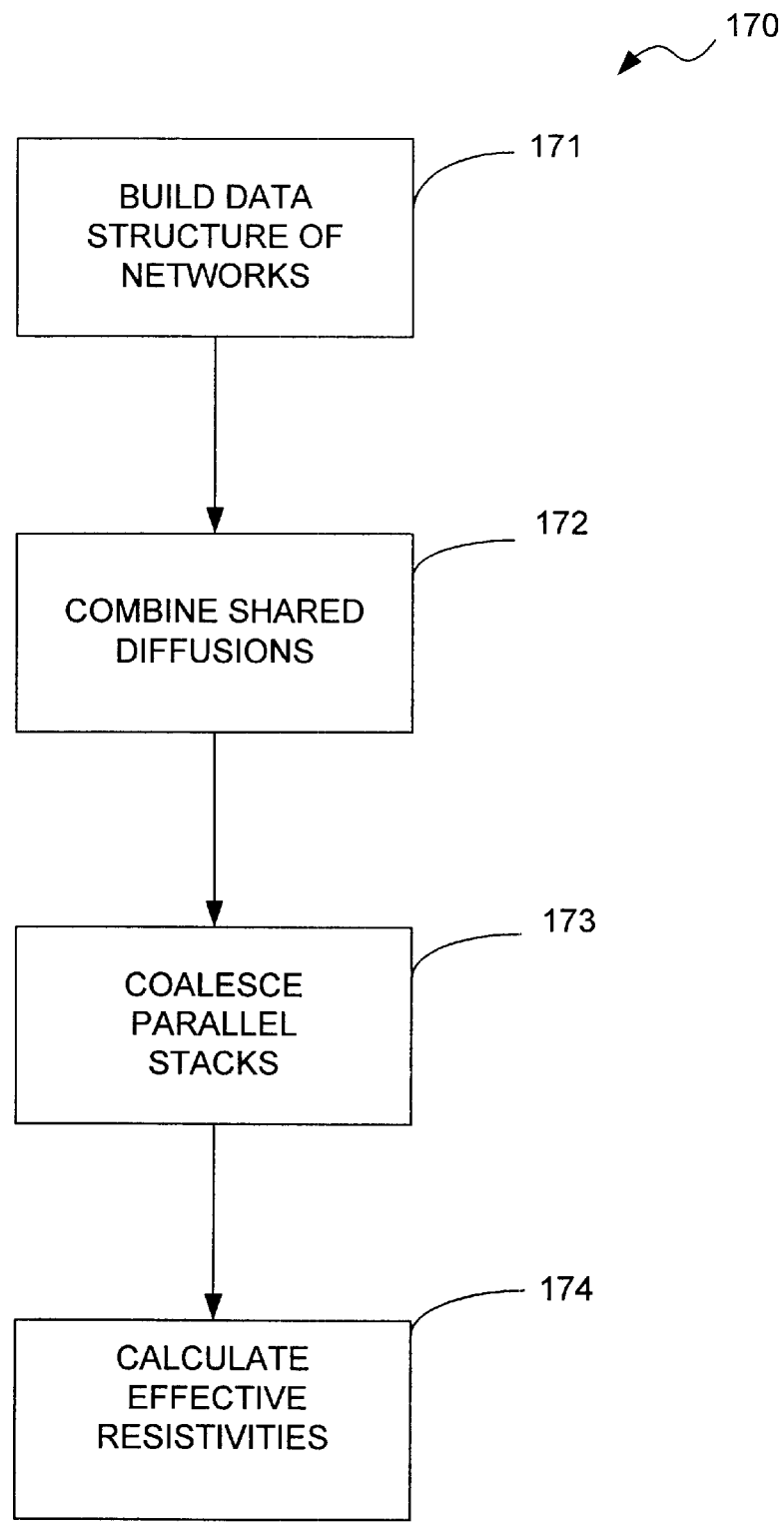
FIG. 7 is a flow chart which illustrates the method of the present invention for determining the strongest and weakest paths from the supply and ground nodes of the gate shown in FIG. 4 to the output node of the gate.

FIG. 7 is a flowchart 170 illustrating the method of the present invention for calculating the strongest an weakest paths from VDD and from ground to the output node X. The rules checker 100 utilizes the aforementioned database to calculate the strongest and weakest paths through the circuit. As stated above, the data structures of the FETs that are contained in the database include the widths and lengths of the FETs. Also, the data structures of the nodes and elements provide connectivity information that is utilized by the rules checker 100 to traverse the networks of the gate being evaluated. The rules checker 100 utilizes this connectivity information to traverse the networks, obtains the widths and lengths of the FETs along the paths traversed and calculates the strongest and weakest paths.

The first step in the process performed by the rules checker 100 is represented by block 171 in FIG. 7. Prior to calculating the strongest and weakest paths, the rules checker 100 builds data structures of the networks in the gate. For example, if the rules checker 100 is determining the strongest and weakest paths from VDD to the output node X of the gate 138, the rules checker 100 will begin traversing the network from the output node 147 and will recursively build the data structure of the PFET network between the output node 147 and VDD. Therefore, the rules checker 100 will begin with one of the FETs 141 or 143 connected to node 147 and will obtain the node on the opposite side of the FET. The rules checker 100 will then determine which FETs are connected to the opposite node and will add those FETs to the data structure of the network. This process will continue until the rules checker 100 has reached VDD and has determined that all of the FETs between VDD and the output node 147 have been included in the data structure of the network.

Figure 8:
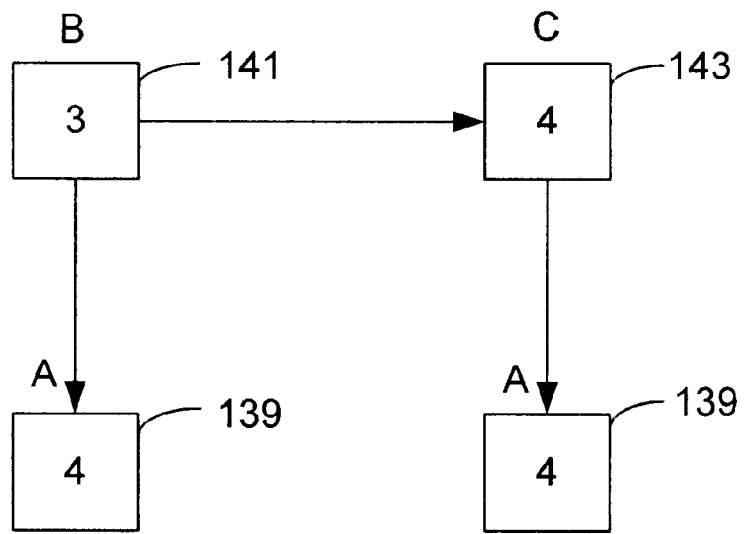
FIGS. 8 and 9 illustrate the step illustrated in the flow chart shown in FIG. 7 for combining shared diffusions.

FIG. 8 illustrates an example of this network data structure. The network data structure shown in FIG. 8 corresponds to the PFET network of the gate 138 shown in FIG. 4. The values within the boxes correspond to the widths of the PFETs. The letters above the boxes indicate the input signals applied to the gates of the PFETs. The PFETs have been numbered with numbers identical to those used in FIG. 4. The data structure shown in FIG. 8 includes the connectivity of the PFETs 139, 141 and 143 and the widths of these PFETs. When the rules checker 100 traverses the network, assuming it begins with PFET 141, the rules checker 100 will determine that PFET 143 is channel-connected to PFET 139 and to PFET 143, as indicated by the arrows in FIG. 8. The rules checker 100 will then determine that PFET 143 is channel-connected to PFET 139. The rules checker 100 will determine that PFET 139 is channel-connected to the supply.

Once the data structure of the network has been generated, the rules checker performs the step represented by block 172 in FIG. 7. Block 172 will be discussed with reference to FIG. 9 to demonstrate the functions represented by block 172. The first step performed by the rules checker 100 after the data structure of the network has been generated is to combine shared diffusions. It can be seen from FIG. 8 that duplicate sub-trees can exist in the network data structure. The data structure shown in FIG. 8 has a duplicate sub-tree from PFETs 141 and 143 to PFET 139. One of these sub-trees has been eliminated from the data structure of the network to obtain the data structure shown in FIG. 9.

Figure 9:
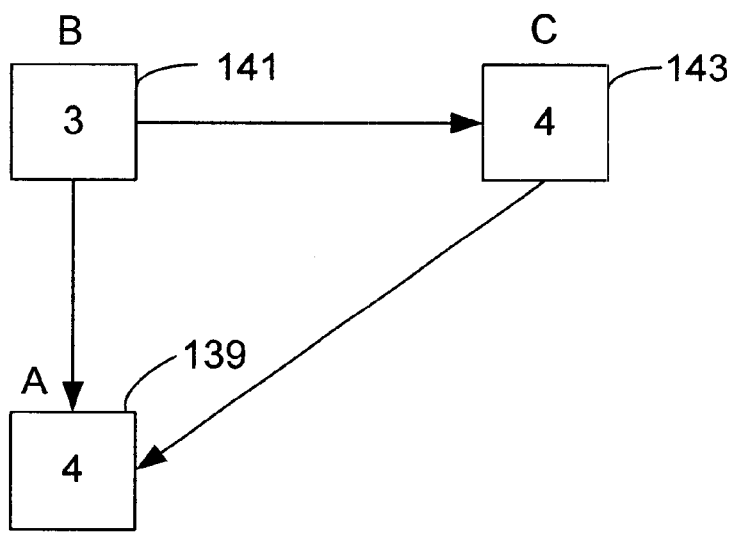

In the data structure represented by FIG. 9, only one incidence of the PFET 139 exists. The pointers of the PFETs 141 and 143 have been set to the same incidence of the PFET 139. By reducing redundancy in this manner, the amount of processing required to be performed by the rules checker 100 in order to determine the strongest and weakest paths through the network can also be reduced.

Figure 10:
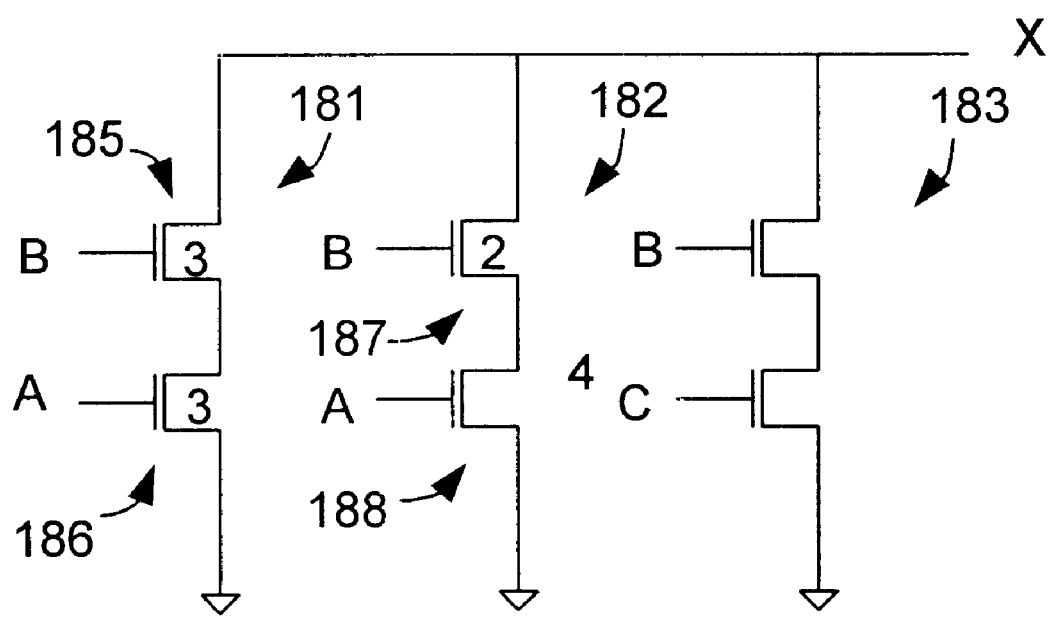
FIG. 10 illustrates the step illustrated in the flow chart shown in FIG. 7 for coalescing parallel stacks in the gate shown in FIG. 7.

Once the rules checker 100 has combined the shared diffusions, the rules checker 100 coalesces stacks of FETs, as indicated by block 173 in FIG. 7. The task of coalescing stacks will be discussed with reference to FIG. 10. FIG. 10 is a schematic diagram which illustrates three stacks of NFETs 181, 182 and 183. All three of these stacks are connected to the output node of the circuit, which is labeled X in FIG. 10. The stacks are also connected to ground, GND, as shown. The stacks 181 and 182 comprise NFETs 185, 186, 187 and 188 which have input signals A or B applied to their gates.

Since the stack 181 and the stack 182 are in parallel, and since each stack 181 and 182 receives common input signals, A and B, the stacks 181 and 182 can be combined. Therefore, the NFETs 185 and 187 which receive input signal B can be combined into a single NFET by multiplying the widths of the NFETs together and by dividing the product of the widths by the sum of the widths. Therefore, since the NFET 185 has a width of 3 and the NFET 187 has a width of 2, the NFETs 185 and 187 can be combined into a single FET having a width of 5. Similarly, the NFETs 186 and 188 which have widths of 3 and 4, respectively, can be combined into a single FET having a width of 7. Since the stack 183 does not have the same input signals as the tacks 181 and 182, the stack 183 cannot be combined with either of the stacks 181 or 182.

When the rules checker 100 combines two FETs, one of the FETs is eliminated from the data structure and one of the FETs is retained in the data structure. The retained FET is assigned the new width. Therefore, in this example, the two retained FETs would be assigned a width of 5 and 7, respectively. The pointers of the nodes to which the eliminated FET was connected are then set to point to the retained FET in the network data structure.

Once the rules checker 100 has completed the step of coalescing parallel stacks, the rules checker 100 utilizes the network data structure to calculate the effective resistances of the network in the manner discussed above with reference to FIG. 6. Therefore, the rules checker 100 converts the widths of the FETs in the network data structure into resistivity values and utilizes these resistivity values to determine the strongest and weakest paths from VDD and ground to the output node of the gate being evaluated. It should be noted that these resistivity values can be generated and included in the network data structure when the network data structure is generated. Alternatively, the resistivity values can be obtained at some other time, such as at the time that the rules checker 100 begins the step represented by block 174 in the flow chart of FIG. 7.

The effective resistances are then used to generate the PFET-to-NFET ratios of the inverter models. These ratios may then be utilized by the rules checker 100 to evaluate the aforementioned design characteristics. It should be noted that the process represented by the flow chart 170 of FIG. 7 is separately performed for the PFET and NFET networks. The process is performed in an identical manner in both cases with the exception that for one of the networks, the rules checker 100 traverses the network from the output node X to VDD, whereas for the other network, the rules checker 100 traverses the network from the output node X to ground GND.

It should be noted that the foregoing description is not intended to be exhaustive or to limit the invention to the precise forms disclosed. Those skilled in the art will understand that modifications or variations are possible in light of the above teachings, which are within the scope of the present invention. In this regard, the embodiment discussed above was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention.

What is claimed is:

1. An apparatus for determining a strongest path and a weakest path from a supply voltage of a gate to an output node of the gate and for determining the strongest and weakest paths from a ground of the gate to the output node of the gate, the apparatus comprising:
   logic configured to analyze characteristics of the gate to determine effective strengths of P field effect transistor (PFET) networks and N field effect transistor (NFET) networks comprised in the gate, the logic utilizing the effective strengths of the networks to determine the strongest and weakest paths from the supply voltage to the output node and from ground to the output node.

2. The apparatus of claim 1, wherein said logic is a computer configured to execute a rules checker program, wherein when the rules checker program is run on the computer, the rules checker program analyzes the characteristics of the gate to determine the effective strengths of the PFET networks and of the NFET networks comprised in the gate, wherein the rules checker program utilizes the effective strengths to determine the strongest and weakest paths from the supply voltage to the output node and from ground to the output node.

3. The apparatus of claim 2, wherein the PFET network comprises a plurality of P field effect transistors (PFETs) and wherein the NFET network comprises a plurality of N field effect transistors (NFETs), the characteristics of the gate including the widths and lengths of PFETs and NFETs, the rules checker program utilizing the widths and lengths to calculate the strengths of the PFETs and NFETs, the rules checker program utilizing the strengths of the NFETs and PFETs to calculate the effective strengths of the NFET and PFET networks.

4. The apparatus of claim 3, wherein once the rules checker program has calculated the strongest and weakest paths, the rules checker program utilizes information relating to the strongest and weakest paths to obtain a PFET-to-NFET ratio for the gate and wherein the rules checker program utilizes the PFET-to-NFET ratio to evaluate design qualities of the gate.

5. The apparatus of claim 4, wherein prior to determining the strongest and weakest paths, the rules checker program traverses each of the networks and generates a network data structure for the PFET network and for the NFET network, each network data structure defining a tree structure of field effect transistors (FETs) comprised in each network, and wherein the rules checker program eliminates redundant sub-trees comprised in the tree structures and coalesces parallel sub-trees having identical inputs, wherein once the rules checker program has eliminated redundant sub-trees and has coalesced parallel sub-trees having identical inputs, the rules checker program utilizes the network data structures to calculate the effective strengths of the NFET and PFET networks.

6. The apparatus of claim 5, wherein the strength of each FET is determined by dividing the width of the FET by the length of the FET, wherein each FET has a resistivity value equal to a reciprocal of the strength of the FET, wherein the rules checker program utilizes the resistivity values of the FETs to calculate the effective strengths of the NFET and PFET networks contained in the respective network data structures.

7. The apparatus of claim 6, wherein once the rules checker program has calculated the effective strengths of the PFET and NFET networks, the rules checker program utilizes the effective strengths to determine the strongest and weakest paths from the supply voltage of the gate to the output node of the gate and from ground to the output node of the gate.

8. The apparatus of claim 7, wherein once the rules checker program has determined the strongest and weakest paths from the supply voltage of the gate to the output node of the gate and from ground to the output node of the gate, the rules checker program utilizes information relating to the determination of the strongest and weakest paths to obtain first and second inverter PFETs having first and second strengths, respectively, first and second inverter NFETs having third and fourth strengths, respectively, the first inverter PFET and NFET corresponding to a strongest path through the PFET network from the supply voltage to the output node and a weakest path through the NFET network from ground to the output node, the second inverter PFET and NFET corresponding to a weakest path through the PFET network from the supply voltage to the output node and a strongest path through the NFET network from ground to the output node, and wherein the rules checker program obtains a ratio of the strengths of the first inverter PFET to the first inverter NFET and a ratio of the strengths of the second inverter PFET to the second inverter NFET, and wherein the rules checker program utilizes these ratios to evaluate the design qualities of the gate.

9. A method for determining a strongest path and a weakest path from a supply voltage of a gate and from a ground of the gate to an output node of the gate, the method comprising the steps of:

analyzing characteristics of the gate to determine effective strengths of a P field effect transistor (PFET) network and of an N field effect transistor (NFET) network comprised in the gate; and utilizing the effective strength of the NFET and PFET networks to determine the strongest and weakest paths from the ground of the gate and from the supply voltage of the gate to the output node of the gate.

10. The method of claim 9, wherein the PFET network comprises a plurality of P field effect transistors (PFETs) and wherein the NFET network comprises a plurality of N field effect transistors (NFETs), the characteristics of the gate including the widths and lengths of the PFETs and NFETs, the analyzing step including the step of utilizing the widths and lengths to calculate the strengths of the PFETs and NFETs, the rules checker program utilizing the strengths of the NFETs and PFETs to calculate the effective strengths of the NFET and PFET networks.

11. The method of claim 10, wherein the analyzing and utilizing steps are performed by a rules checker program being executed by a computer, wherein after the rules checker program has determined the strongest and weakest paths, the rules checker program utilizes information relating to the strongest and weakest paths to obtain a PFET-to-NFET ratio for the gate and wherein the rules checker program utilizes the PFET-to-NFET ratio to evaluate design qualities of the gate.

12. The method of claim 11, wherein during the analyzing step, the rules checker program traverses each of the networks and generates a network data structure for the PFET network and for the NFET network, each network data structure defining a tree structure of field effect transistors (FETs) comprised in each network, and wherein the rules checker program eliminates redundant sub-trees comprised in the tree structures and coalesces parallel sub-trees having identical inputs, wherein once the rules checker program has eliminated redundant sub-trees and has coalesced parallel sub-trees having identical inputs, the rules checker program utilizes the network data structures in the utilizing step to calculate the effective strengths of the NFET and PFET networks.

13. The method of claim 12, wherein the strength of each FET is determined by dividing the width of the FET by the length of the FET, wherein each FET has a resistivity value equal to a reciprocal of the strength of the FET, wherein the rules checker program utilizes the resistivity values of the FETs during the utilizing step to calculate the effective strengths of the NFET and PFET networks contained in the respective network data structures.

14. The method of claim 13, wherein once the rules checker program has calculated the effective strengths of the PFET and NFET networks, the rules checker program utilizes the effective strengths to determine the strongest and weakest paths from the supply voltage of the gate to the output node of the gate and from ground to the output node of the gate.

15. The method of claim 14, wherein after the rules checker program has performed the utilizing step and has determined the strongest and weakest paths from the supply voltage of the gate to the output node of the gate and from ground to the output node of the gate, the rules checker program utilizes information relating to the determination of the strongest and weakest paths to obtain first and second inverter PFETs having first and second strengths, respectively, first and second inverter NFETs having third and fourth strengths, respectively, the first inverter PFET and NFET corresponding to a strongest path through the PFET network from the supply voltage to the output node and a weakest path through the NFET network from ground to the output node, the second inverter PFET and NFET corresponding to a weakest path through the PFET network from the supply voltage to the output node and a strongest path through the NFET network from ground to the output node, and wherein the rules checker program obtains a ratio of the strengths of the first inverter PFET to the first inverter NFET and a ratio of the strengths of the second inverter PFET to the second inverter NFET, and wherein the rules checker program utilizes these ratios to evaluate the design qualities of the gate.

* * * * *